(12) United States Patent
Ramm et al.

(10) Patent No.: US 7,943,017 B2
(45) Date of Patent: May 17, 2011

(54) METHOD FOR OPERATING A PULSED ARC EVAPORATION SOURCE AND VACUUM PROCESS SYSTEM COMPRISING SAID PULSED ARC EVAPORATION SOURCE

(75) Inventors: Jürgen Ramm, Maienfeld (CH); Beno Widrig, Bad Ragaz (CH); Daniel Lendi, Grabs (CH); Volker Derflinger, Feldkirch (AT); Andreas Reiter, Feldkirch (AT)

(73) Assignee: Oerlikon Trading AG, Trubbach, Trubbach (CH)

( * ) Notice: Subject to any disclaimer, the term of this patent is extended or adjusted under 35 U.S.C. 154(b) by 910 days.

(21) Appl. No.: 11/908,542

(22) PCT Filed: Mar. 1, 2006

(86) PCT No.: PCT/CH2006/000125
§ 371 (c)(1),
(2), (4) Date: Sep. 13, 2007

(87) PCT Pub. No.: WO2006/099760
PCT Pub. Date: Sep. 28, 2006

(65) Prior Publication Data
US 2008/0173536 A1   Jul. 24, 2008

(30) Foreign Application Priority Data

Mar. 24, 2005 (CH) .......................... 518/05
Aug. 3, 2005 (CH) ......................... 1289/05

(51) Int. Cl.
*C23C 14/00* (2006.01)
(52) U.S. Cl. .............................. 204/192.38; 204/298.41
(58) Field of Classification Search ............. 204/192.38, 204/298.41
See application file for complete search history.

(56) References Cited

U.S. PATENT DOCUMENTS

| 3,836,451 A | * | 9/1974 | Snaper .................... 204/298.41 |
| 4,645,895 A | * | 2/1987 | Boxman et al. ............ 219/76.13 |
| 4,877,505 A | * | 10/1989 | Bergmann ............... 204/192.38 |
| 5,948,224 A | * | 9/1999 | Signer et al. ............ 204/298.08 |

FOREIGN PATENT DOCUMENTS

| EP | 0 666 335 A1 | * | 8/1995 |
| JP | 01-042574 | * | 2/1989 |

OTHER PUBLICATIONS

Machine Translation of EP 0 666 335 A1 dated Aug. 1995.*

* cited by examiner

*Primary Examiner* — Rodney G McDonald
(74) *Attorney, Agent, or Firm* — Natoro, Michalos & Zaccaria P.C.

(57) ABSTRACT

A vacuum process system for surface-treating work pieces uses an arc evaporation source. The system has a first electrode connected to a DC power source and a second electrode, disposed separately from the arc evaporation source. The two electrodes are operated while being connected to a single pulsed power supply.

33 Claims, 4 Drawing Sheets

METHOD FOR OPERATING A PULSED ARC EVAPORATION SOURCE AND VACUUM PROCESS SYSTEM COMPRISING SAID PULSED ARC EVAPORATION SOURCE

FIELD AND BACKGROUND OF THE INVENTION

The invention relates to a vacuum process installation for the surface treatment of workpieces with an arc evaporator source according to the preamble of claim 1 as well as to a method for operating an arc evaporator source according to the preamble of claim 14.

The operation of arc evaporator sources, also known as spark cathodes, by feeding with electrical pulses has already been known in prior art for a relatively long time. With arc evaporator sources high evaporation rates and consequently high deposition rates can be economically attained in coating. The structuring of such a source can, moreover, be technically relatively easily realized as long as higher requirements are not made of the pulse operation and the pulsing is more or less restricted to the ignition of a DC discharge. These sources operate at currents typically in the range of approximately 100 A and more, and at voltages of a few volts to a few tens of volts, which can be realized with relatively cost-effective DC power supplies. A significant disadvantage with these sources comprises that in the proximity of the cathode spot very rapidly proceeding melting occurs on the target surface, whereby drops are formed, so-called droplets, which are hurled away as splatters and subsequently condense on the workpiece and consequently have an undesirable effect on the layer properties. For example, the layer structure thereby becomes inhomogeneous and the surface roughness becomes inferior. With high requirements made of the layer quality, layers generated thusly can often not be commercially applied. Attempts have therefore already been made to reduce these problems by operating the arc evaporator source in pure pulse operation of the power supply. While it has already been possible to partially raise the ionization with pulse operation, however, depending on the setting of the operating parameters, the formation of splatters was additionally even negatively affected.

The use of reactive gases for the deposition of compounds from a metallic target in a reactive plasma was until now only possible within narrow limits, since the problem of splatter formation in such processes is additionally exacerbated, in particular if non-conducting, thus dielectric, layers are to be generated, such as for example oxides using oxygen as the reactive gas. The re-coating of the target surfaces of the arc evaporator and of the counterelectrodes, such as the anodes and also other parts of the vacuum process installation, with a non-conducting layer leads to entirely unstable conditions and even to the quenching of the arc. In this case the latter would have to be repeatedly newly ignited or it would thereby become entirely impossible to conduct the process.

EP 0 666 335 B1 proposes for the deposition of purely metallic materials with an arc evaporator to superimpose onto the DC current a pulsing current in order to be able to lower hereby the DC base current for the reduction of the splatter formation. Pulse currents up to 5000 A are here necessary, which are to be generated with capacitor discharges at relatively low pulse frequencies in the range of 100 Hz to 50 kHz. This approach is proposed for the prevention of the droplet formation in the non-reactive evaporation of purely metallic targets with an arc evaporator source. A solution for the deposition of non-conducting dielectric layers is not stated in this document.

In the reactive coating by means of an arc evaporator source there is a lack of reactivity and process stability, especially in the production of insulating layers. In contrast to other PVD processes (for example sputtering), insulating layers can only be produced by means of arc evaporation with electrically conducting targets. Working with high frequency, such as is the case during sputtering, has so far failed due to the lacking technique of being able to operate high-power supplies with high frequencies. Working with pulsed power supplies appears to be an option. However, in this case the spark, as stated, must be ignited repeatedly or the pulse frequency must be selected so large that the spark is not extinguished. This appears to function to some degree in applications for special materials, such as graphite.

In the case of oxidized target surfaces, repeated ignition via mechanical contact and by means of DC supplies is not possible. Other types of fast ignition processes are technically complex and limited with respect to their ignition frequency. The actual problems in reactive arc evaporation are the coating with insulating layers on the target and on the anode or the coating chamber. These coatings increase the burn voltage of the spark discharge, lead to increased splatters and spark-overs, an unstable process, which ends in an interruption of the spark discharge. Entailed herein is a covering of the target with the growth of islands which decreases the conducting surface. A highly diluted reactive gas (for example argon/oxygen mixture) can slow the accretion on the target, however, it cannot solve the fundamental problem of process instability. While the proposal according to U.S. Pat. No. 5,103,766 to operate the cathode and the anode optionally with a new ignition each time, contributes to process stability, however, it does lead to increased splatters.

The resolution via a pulsed power supply, as is possible for example in reactive sputtering, cannot be applied in a classic spark evaporation. The reason lies therein that a glow discharge has a "longer life" than a spark when the current entry is interrupted.

In order to circumvent the problem of the coating of the target with an insulating layer, in reactive processes for the production of insulating layers either the reactive gas inlet is locally separated from the target (in that case the reactivity of the process is only ensured if the temperature on the substrate also permits an oxidation reaction) or a separation between splatters and ionized fraction is carried out (so-called filtered arc) and the reactive gas after the filtering is added to the ionized vapor. The previous patent application CH 00518/05 shows essentially an approach to a solution to this problem and the invention introduced in the present patent application represents a further development which claims priority of such application, and such is consequently an integrated component of this application.

In contrast to sputtering, coating by means of cathodic spark is substantially an evaporation process. It is supposed that in the transition between hot cathode spot and its margin, portions are entrained which are not of atomic size. These conglomerates impinge as such onto the substrate and result in coarse layers, and it has not been possible fully to react-through the splatters. Avoidance or fragmentation of these splatters was so far not successful, especially not for reactive coating processes. In these forms on the spark cathode, in, for example, oxygen atmosphere, additionally a thin oxide layer, which tends to increased splatter formation. The cited patent application CH00518/05 provided a first solution which is especially well suited for completely reacted target surfaces and has a markedly reduced splatter formation. Nevertheless, a further reduction of the splatters and their size is desirable.

There is further the wish for additional reduction or scaling capability of the thermal loading of the substrates and the ability to conduct low-temperature processes in the cathodic spark coating.

In WO 03018862 the pulse operation of plasma sources is described as a feasible path for reducing the thermal loading on the substrate. However, the reasons offered there apply to the field of sputter processes. No reference is established to spark evaporation.

With respect to prior art, a summary of the following disadvantages is provided:
1. The reactivity in coating by means of cathode arc evaporation is unsatisfactory.
2. There is no fundamental solution of the problematic of splatters: conglomerates (splatters) are not fully reacted-through—>roughness of the coating surface, constancy of the coating composition and stoichiometry.
3. No stable processes are possible for the deposition of insulating layers.
4. The subsequent ionization of splatters is unsatisfactory.
5. Unsatisfactory possibilities of realizing low-temperature processes.
6. Further reduction of the thermal loading of the substrates is unsatisfactory.

SUMMARY OF THE INVENTION

The present invention addresses the problem of eliminating said disadvantages of prior art. The problem addressed is in particular depositing economically layers with at least one arc evaporator source, such that the reactivity during the process is increased through better ionization of the vaporized material and of the reactive gas participating in the process. In this reactive process the size and frequency of the splatters is to be significantly reduced, in particular in reactive processes for the production of insulating layers. Further, better process control is to be made possible, such as the control of the evaporation rates, increase of the layer quality, settability of the layer properties, improvement of homogeneity of the reaction, as well as the reduction of the surface roughness of the deposited layer. These improvements are in particular also of importance in the production of graduated layers and/or alloys.

The process stability in reactive processes for the production of insulating layers is to be generally increased. Moreover, a low-temperature process is to be realized, even at high economy of process. Furthermore, the expenditures for the device and in particular for the power supply for the pulsed operation is to be kept low. Said problems may occur singly as well as also in combination depending on the particular required field of application.

The problem is solved according to the invention through a vacuum process installation according to claim 1 and by proceeding according to a method as claimed in claim 13. The dependent claims define further advantageous embodiment forms.

The problem is solved according to the invention thereby that a vacuum process installation for the surface working of workpieces with at least one arc evaporator source is provided, which is connected to a DC power supply and represents a first electrode, wherein additionally a second electrode, disposed separate from the arc evaporator source, is provided and that the two electrodes are connected with a pulsed power supply. Between the two electrodes, consequently, an additional discharge gap is operated with only a single pulsed power supply, which permits an especially high ionization of the involved materials at very good controllability of the process.

The second electrode can herein be a further arc evaporator source, a sputter source, such as preferably a magnetron source, a workpiece holder or the workpiece itself, whereby the second electrode in this case is operated as bias electrode or the second electrode can also be implemented as an evaporation crucible, which forms the anode of a low-voltage arc evaporator.

An especially preferred implementation comprises that both electrodes are the cathodes of one arc evaporator source each, and that both of these arc evaporator sources are each directly with one DC power supply each for maintaining the spark current such that the arcs or the arc discharges of the two sources in bipolar operation with the pulsed power supply are not extinguished. In this configuration, consequently, only one pulsed power supply is required since the latter is connected directly between the two cathodes of the arc evaporator. In addition to the high degree of ionization and the good controllability of the process, high efficiency of the configuration is also obtained. Between these two electrodes and the pulse discharge gap generated additionally thereby, opposite this discharge gap a bipolar pulse is electrically formed with negative and positive components whereby the entire period duration of this fed AC voltage can be utilized for the process. No unutilized pulse pauses are, in fact, generated and the negative as well as also the positive pulse make overall contribution to the process without interruption. This contributes to the splatter reduction, stabilizes reactive coating processes, increases the reactivity and the deposition rate without having to employ additional expensive pulsed power supplies. This configuration with two arc evaporator sources is in particular suitable for the deposition of layers from a metallic target using reactive gas. Plasma processes operated with inert gases, such as argon, are known to be rather stable. As soon as reactive gas is added, to be able to deposit different metallic and semimetallic compounds, the process management becomes difficult since the process parameters in this case are shifted and consequently instabilities occur which can even make the process management impossible. This problematic is especially apparent if non-conducting layers are to be generated, such as in particular oxidic layers using oxygen as the reactive gas. Said configuration with two arc evaporator sources solves this problem in simple manner. With this configuration it becomes even possible to omit supporting inert gases, such as argon, and it is possible to work with pure reactive gas, even surprisingly with pure oxygen. Through the high ionization degree attainable therewith of the vaporized material as well as of the reactive gas, such as with oxygen, nonconducting layers are generated with high quality, which nearly reach the quality of the bulk material. The process herein proceeds highly stably and surprisingly herein also the splatter formation is additionally drastically reduced or nearly entirely avoided. However, said advantages can also be achieved by using other sources as the second electrode, as for a sputter electrode, a bias electrode, an auxiliary electrode or a low-voltage arc evaporator crucible, although said advantageous effects are not attained in the same degree as in the implementation of the configuration with two arc evaporators.

The various features of novelty which characterize the invention are pointed out with particularity in the claims annexed to and forming a part of this disclosure and are entirely based on the Switzerland priority application no. 518/05, filed Mar. 24, 2005, and Switzerland priority application no. 1289/05, filed Aug. 3, 2005.

BRIEF DESCRIPTION OF THE DRAWINGS

In the following the invention will be explained in further detail by example and schematically in conjunction with Figures. The Figures depict:

FIG. 1 schematically an illustration of an arc evaporator coating installation, such as corresponds to prior art, FIG. 2 a configuration according to the invention with two DC-fed arc evaporator sources in operation with superimposed high-current pulse, FIG. 3 configuration with two DC-fed arc evaporator sources and interconnected high-current pulse supply according to the invention with ground-free operation, FIG. 4 a configuration with DC-fed arc evaporator source and a second electrode as substrate holder with interconnected high-current pulse supply, FIG. 5 configuration with a DC-operated arc evaporator source and the second electrode as DC-operated magnetron sputter source with interconnected high-current pulse supply, FIG. 6 configuration with a DC-fed arc evaporator source and with a second electrode as evaporation crucible of a low-voltage arc evaporation configuration and interconnected high-current pulse supply, FIG. 7 the voltage pulse form of the high-current pulse supply.

Figure 1:
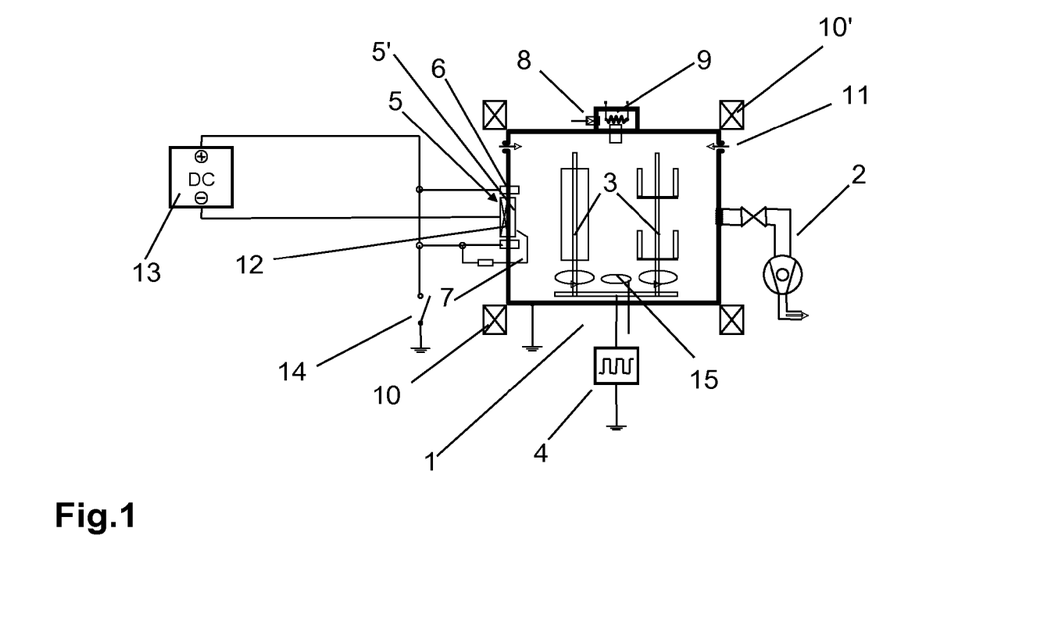

FIG. 1 depicts a vacuum process installation which shows a configuration known from prior art for operating an arc evaporator source (5) with a DC power supply (13). The installation (1) is equipped with a pump system (2) for setting up the necessary vacuum in the chamber of the vacuum process installation (1). The pump system (2) permits operating the coating installation at pressures $<10^{-1}$ mbar and also ensures the operation with the typical reactive gases, such as $O_2$, $N_2$, $SiH_4$, hydrocarbons, etc. The reactive gases are introduced via a gas inlet (11) into the chamber (1) and here appropriately distributed. It is additionally possible through further gas inlets to introduce additional reactive gases or also inert gases, such as argon, if such appears necessary to utilize the gases singly and/or in mixtures. The workpiece holder (3) located in the installation serves for receiving and for the electrical contacting of the workpieces, not shown here, which conventionally are fabricated of metallic or ceramic materials and which are coated with hard material or wear-protection layers in such processes. A bias power supply (4) is electrically connected with the workpiece holder (3) to impress a substrate voltage or a bias voltage on the workpieces. The bias power supply (4) can be a DC, an AC or a bipolar or unipolar pulse substrate power supply. Via a process gas inlet (11) an inert or a reactive gas can be introduced in order to preset and to control process pressure and gas composition in the treatment chamber.

Components of the arc evaporator source (5) are a target 5' with cooling plate placed behind it and preferably with magnet system, an ignition finger (7), which is located in the periphery region of the target surface, as well as an anode (6) encompassing the target. With a switch (14) it is possible to select between floating operation of the anode (6) of the positive pole of the power supply (13) and operation with defined zero or ground potential. For example during the ignition of the arc of the arc evaporator source (5), with the ignition finger (7) a brief contact with the cathode is established and the finger subsequently retracted whereby a spark is ignited. The ignition finger (7) is for this purpose connected, for example, via a current limiter resistor to anode potential.

The vacuum process installation (1) can additionally, should the process management make such necessary, be optionally equipped with an additional plasma source (9). In this case the plasma source (9) is implemented as a source for generating a low-voltage arc with a hot cathode. The hot cathode is implemented for example as a filament, which is located in a small ionization chamber into which is introduced with a gas inlet (8) a working gas, such as for example argon, for generating a low-voltage arc discharge, which extends into the main chamber of the vacuum process installation (1). An auxiliary anode (15) for the implementation of the low-voltage arc discharge is appropriately positioned in the chamber of the vacuum process installation (1) and is operated in known manner with a DC power supply between cathode and the plasma source (9) and the anode (15). If necessary, additional coils (10, 10') can be provided, such as for example Helmholtz-like configurations, which are placed about the vacuum process installation (1) for the magnetic focusing or guidance of the low-voltage arc plasma.

Figure 2:
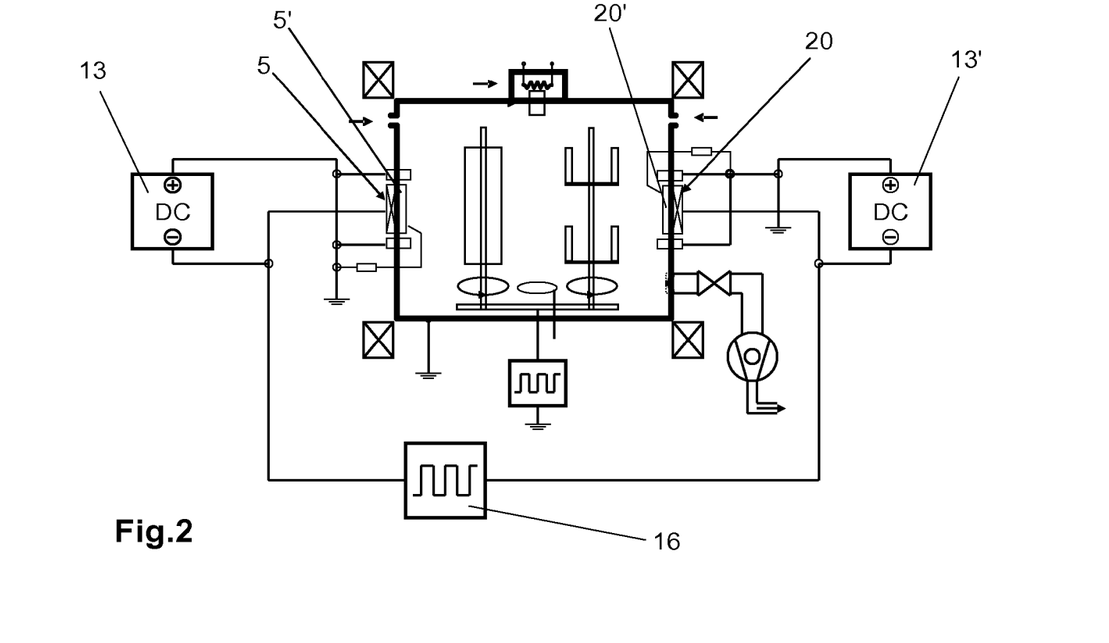

According to the invention, in addition to a first arc evaporator source (5) with the target electrode (5'), a second arc evaporator source (20) with the second target electrode (20') is provided, as is shown in FIG. 2. Both arc evaporator sources (5, 20) are each operated with one DC power supply (13) and (13') such that the DC power supplies with a base current ensure that the arc discharge is maintained. The DC power supplies (13, 13') correspond to present prior art and can be cost-effectively realized. The two electrodes (5', 20') which form the cathodes of the two arc evaporator sources (5, 20) are connected according to the present invention with a single pulsed power supply (16), which is capable to output to the two electrodes (5', 20') high pulse currents with defined form and edge slope of the pulses. In the depicted configuration according to FIG. 2 the anodes (6) of the two arc evaporator sources (5, 20) are referred to the electrical potential of the frame of the process installation (1).

Figure 3:
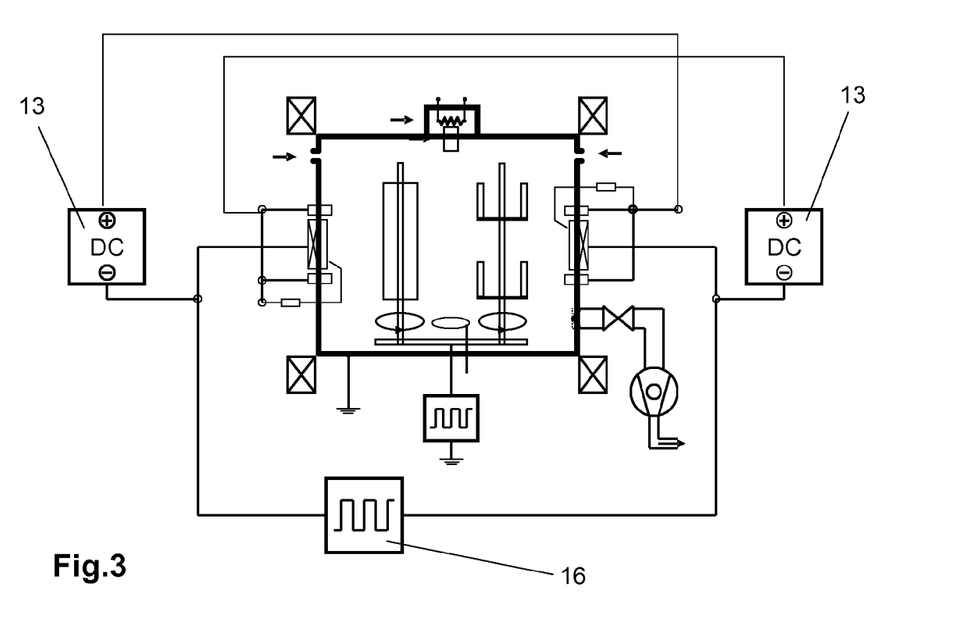

As depicted in FIG. 3, it is however also possible to operate the spark discharges ground-free. In this case the first DC power supply (13) is connected with its negative pole to the cathode (5') of the first arc evaporator source (5) and its positive pole with the opposite anode of the second arc evaporator source (20). The second arc evaporator source (20) is operated analogously and the second power supply (13') is connected with the positive pole of the anode of the first arc evaporator source (5).

The opposite operation of the anodes of the arc evaporator sources leads to better ionization of the materials in the process. The ground-free operation, or the floating operation, of the arc evaporator source (5, 20) can, however, also take place without the use of the opposite anode feed. It is, furthermore, possible to provide a switch (14) in order to be able to switch optionally between floating and grounded operation. As before, the two electrodes (5', 20') which form the cathodes of the two arc evaporator sources (5, 20) are connected according to the present invention with a single pulsed power supply (16).

The supply for this "dual pulsed mode" must be able to cover a multiplicity of impedance ranges and, nevertheless, still be "hard" in the voltage. This means that the supply must supply high currents, yet must, in spite of it, be capable of being largely operated voltage-stably. An example of such a supply is applied parallel with the same date to this patent application at U.S. patent application Ser. No. 11/908,563 filed Sep. 13, 2007.

The first and preferred application field of this invention is that of cathodic spark evaporation with two pulsed arc evaporator sources (5, 20) as is depicted in FIG. 2. For these applications the impedances are at intervals of approximately $0.01\Omega$ to $1\Omega$. It should here be noted that the impedances of the sources between which "dual pulsing" takes place, are different. The reason may be that they are comprised of different materials or alloys, that the magnetic field of the sources is different or that the material erosion of the sources is at a different stage. The "dual pulsed mode" now permits balance via the setting of the pulse width such that both sources draw the same current. As a consequence, this leads to different voltages at the sources. It is understood that the supply with respect to the current can also be loaded asymmetrically if it appears desirable for the conduction of the process, which is the case for graduated layers of different materials. The voltage stability of a supply is increasingly more difficult to realize, the lower the impedance of the particular plasma. Therefore short pulse lengths are often of advantage. The capability of being switched over or the controlled active trackability of a supply to different output impedances is therefore of special advantage if the full range of its power is to be utilized, thus for example from range 500 V/100 A to 50 V/1000 A or as is realized in the parallel application at U.S. patent application Ser. No. 11/908,563.

The advantages of such a dual pulsed cathode configuration, in particular comprised of two arc evaporator sources, are summarized as follows:
1. Increased electron emission with steep pulses results in higher current (also substrate current) and increased ionization of the vaporized material and of the reactive gas.
2. The increased electron density also contributes to a faster discharge of the substrate surface, in the production of insulating layers, i.e. relatively short charge-reversal times on the substrate (or also only pulse pauses of the bias voltage) are sufficient in order to discharge the forming insulating layers.
3. The bipolar operation between the two cathodic arc evaporator sources permits a quasi 100% pulse/pause ratio (duty cycle), while the pulsing of a source alone always necessarily requires a pause and therefore the efficiency is not as high.
4. The dual pulsed operation of two cathodic spark sources, which are opposite one another, immerses the substrate region into dense plasma and increases the reactivity in this region, also that of the reactive gas. This is also reflected in the increase of the substrate current.
5. In reactive processes in oxygen atmosphere still higher electron emission values can be attained in pulsed operation, and it appears that a melting of the spark region, as is the case in classic evaporation of metallic targets, can be largely avoided.

Figure 4:
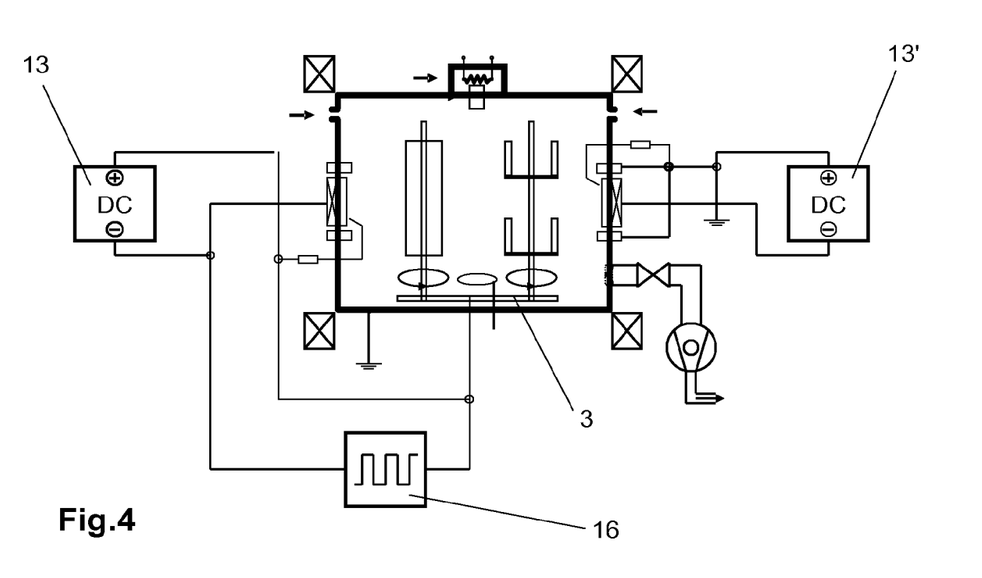

A further preferred variant of the present invention comprises that as the second electrode is utilized, in addition to the first electrode of the arc evaporator source (5), the workpiece holder (3) with the workpieces located thereon, as is depicted in FIG. 4. In this case the single pulsed power supply (16) is connected between the first electrode (5') of the arc evaporator source (5) and the second electrode implemented as workpiece holder (3). To be able to attain stabler discharge conditions, the DC power supply (13) of the arc evaporator source (5) can additionally simultaneously also be connected with the second electrode, the workpiece holder. With this bias operation the ionization conditions, in particular in the proximity of the workpiece surface, can also be specifically and purposefully affected. In this variant the impedances differ significantly from one another. Here also a current balance can be carried out via the voltage pulse width. Since the electrode emission of substrate holder and substrates differs strongly from the electron emission of cathodic arc evaporator, the resulting pulsed voltage does not have a passage through zero (substrate is always anodic). Important in this variant is again the application in the production of insulating layers and additionally the capability of acting upon the substrate with high electron currents. This operation is primarily of interest if the critical issue is to dissociate reactive gases in the proximity of the substrate surface and simultaneously to realize high substrate temperatures.

Figure 5:
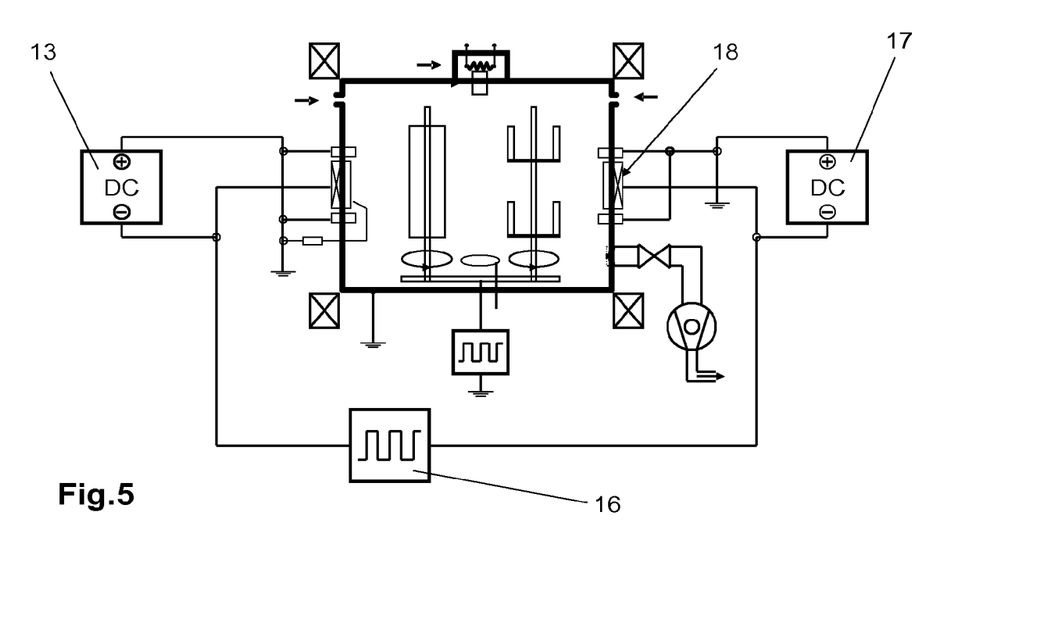

The advantages are summarized in the following:
1. High reactivity in the proximity of the substrate
2. Efficient decomposition of the reactive gas
3. Discharge of the substrates in the deposition of insulating layers
4. Realization of high substrate temperatures is possible A further variant of the invention is shown in FIG. 5, wherein the second electrode is here implemented as sputter target on a sputter source (18). This sputter source (18) is implemented as magnetron sputter source and is in conventional manner fed with a DC power supply (17). With this configuration the advantages of the sputter technique can be combined with the advantages of the arc evaporator technique and this can be done even in reactive processes, in particular in the deposition of dielectric layers or gradient- and alloy layers.

In this case the impedances are also very different. They are between said arc evaporator sources and those of the sputtering with a magnetron source ($10\Omega$-$100\Omega$). If the balance for identical currents is to take place, the pulse lengths must correspondingly be adapted again. In this operating mode it is especially important that the DC supplies from the pulsed supply are decoupled through a filter, which includes, for example, diodes. It has been found that this mode is of advantage especially for reactive processes for the deposition of insulating layers, since not only for the arc evaporator source but especially also for the sputter source very wide process windows can be realized. For example, it is possible to work with constant reactive gas flow and the difficulties entailed in the regulation are avoided. If the two sources are disposed opposite one another, the process plasma extends through the substrates to the other source and prevents the poisoning of the sputter target over wide regions.

Figure 6:
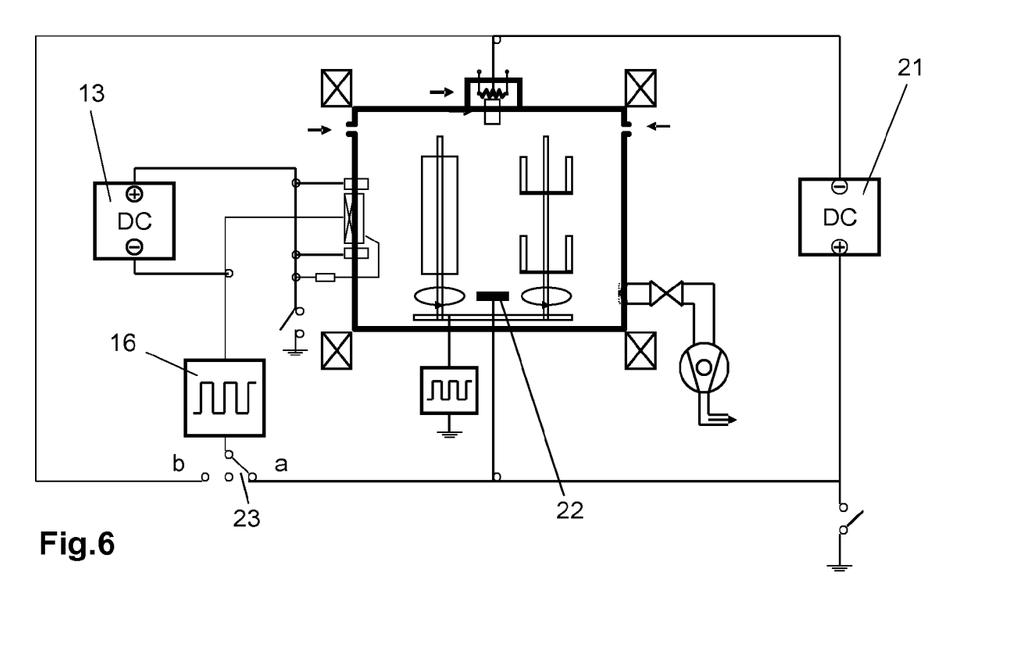

Additional advantages are:
1. Highly enlarged process windows for sputter operation without target poisoning
2. Higher reactivity, especially of the sputter process through higher electron densities In a further implementation of the invention the second electrode is implemented as a evaporation crucible (22), which is a part of a low-voltage evaporation device, as is depicted in FIG. 6. As already explained, the low-voltage arc discharge is operated with a DC power supply (21), which with its positive pole is connected to the evaporation crucible (22), which here serves as anode, and with the negative pole to the filament of an opposite plasma source (9), which here serves as cathode. The low-voltage arc discharge can in known manner be concentrated with the coils (10, 10') onto the crucible (22), wherein here an evaporation material melts and vaporizes. The pulsed power supply (16) is again interconnected between the electrode (5') of the arc evaporator source (5) and the second electrode, of the evaporation crucible (22), in order to attain the desired high degree of ionization. This approach also helps to reduce splatters in the case of materials difficult to vaporize.

It is understood that the crucible of a normal electron beam evaporator can also be utilized as the second electrode for the pulsed power supply.

The advantages are:
1. Dual operation increases the ionization in thermal evaporators 2. Simple combination of thermal evaporation and cathodic spark evaporation
3. More effective decomposition and excitation of the reactive gas in the low-voltage arc discharge
4. Utilization of high electron currents of the spark evaporation for another thermal evaporation
5. Very high flexibility in the conduction of the process.

In order to attain said advantageous process properties in the different possible implementation forms of the invention described above, the pulsed power supply (16) must meet different conditions. In bipolar pulse presentation the process should be capable of being operated at a frequency which is in the range from 10 Hz to 500 kHz.

Figure 7:
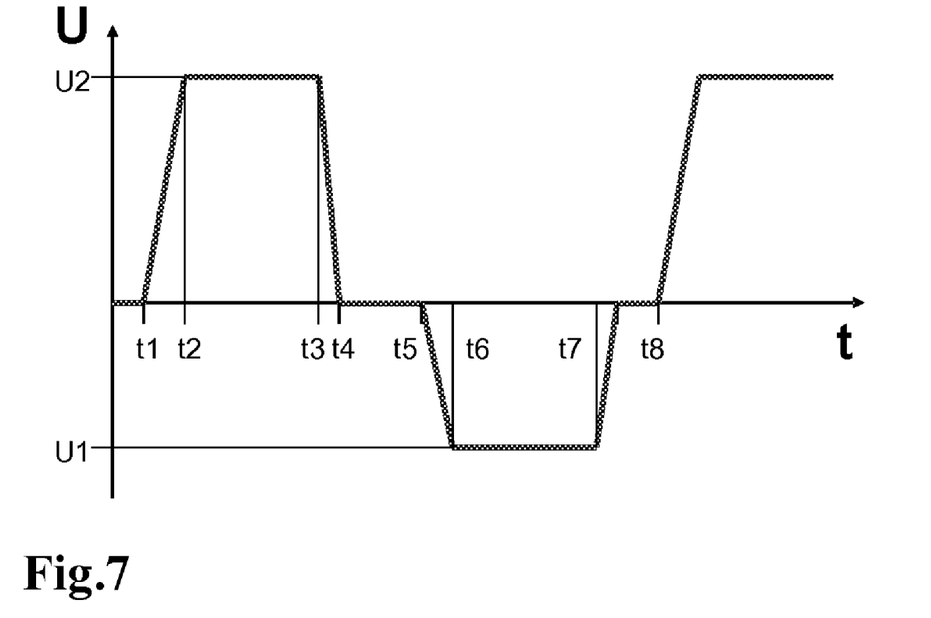

Due to the ionization conditions, herein important is the maintainable edge slope of the pulses. The magnitude of the leading edges U2/(t2-1), U1/(t6-t5), as well as also the trailing edges U2/(t4-3) and U1/(t8-t7) should have at least slopes of greater than 2.0 V/ns measured over the essential portion of the edge extension. They should, however, be at least in the range of 0.02 V/ns to 2.0 V/ns, preferably at least in the range of 0.1 V/ns to 1.0 V/ns and this at least in open-circuit operation, thus without load, however, preferably also under load. It is understood that the edge slope has an effect during operation, depending on the corresponding magnitude of the loading or the connected impedance or the corresponding settings and as such is shown in the diagram according to FIG. 7. The pulse widths in bipolar presentation are, as shown in FIG. 7, for t4 to t1 and t8 to t5 advantageously ≧1 µs, wherein the pauses t5 to t4 and t9 to t8 can advantageously be substantially 0, however, under certain preconditions, can also be ≧0 µs. When the pulse pauses are >0, this operation is referred to as gapped and through, for example, variable time shifts of the pulse gap widths the specific introduction of energy into a plasma and its stabilization can be adjusted. During operation of the pulsed power supply between two electrodes of different impedance, as described above, it can under certain conditions be of advantage if the pulse durations are kept small in order to limit the current rise and the pulsed power supply is operated in gapped mode.

It is especially advantageous if the pulsed power supply is laid out such that pulsed operation up to 500 A at a voltage of 1000 V is possible, wherein the pulse-pause ratio (duty cycle) must herein be taken into consideration accordingly or must be adapted for the laid-out possible power of the supply. Apart from the edge slope of the pulse voltage, it is preferably necessary to ensure that the pulsed power supply (16) is capable of handling a current rise to 500 A in at least 1 µs.

In the following examples the first preferred application of the invention, as it is schematically shown in FIG. 2, will be described. In this case the pulsed high-power supply (16) is operated between two cathodic spark evaporation sources (5, 20). In this operating mode process stability for insulating layers, splatter reduction and higher reactivity of the plasma are achieved.

EXAMPLE 1

Description of a typical process sequence for the production of an Al—Cr—O layer.

In the following a typical sequence of a substrate treatment in a reactive spark coating process is described utilizing the present invention. In addition to the coating process proper, in which the invention is realized, other process steps will also be described which relate to the preparatory and subsequent processing of the substrates. All of these steps allow broad variations, under certain conditions some can also be omitted, shortened or lengthened or be combined differently.

In a first step the substrates are customarily subjected to wet chemical cleaning, which, depending on the material and prior history, is carried out differently.

1. Preparatory processing (cleaning, etc.) of the substrates (methods known to the person skilled in the art).
2. Placing the substrates into the holders provided for this purpose and introduction into the coating system.
3. Pumping the coating chamber to a pressure of approximately $10^{-4}$ mbar by means of a pump system known to the person skilled in the art (forepumps/diffusion pump, forepumps/turbomulecular pump, final pressure approximately $10^{-7}$ mbar achievable)
4. Starting the substrate pretreatment under vacuum with a heating step in an argon-hydrogen plasma or another known plasma treatment. Without limitation, this pretreatment can be carried out with the following parameters:

Plasma of a low-voltage arc discharge with approximately 100 A discharge current, up to 200 A, up to 400 A, the substrates are preferably connected as anode for this low-voltage arc discharge.

Argon flow 50 sccm
Hydrogen flow 300 sccm
Substrate temperature 500° C. (partially through plasma heating, partially through radiation heating)
Process time 45 min During this step a supply is preferably placed between substrates and ground or another reference potential, with which the substrates can be acted upon with DC (preferably positive) or DC pulsed (unipolar, bipolar) or as IF or RF.

5. Etching is started as the next process step. For this step the low-voltage arc is operated between the filament and the auxiliary anode. A DC, pulsed DC, IF or RF supply is connected between substrates and ground and the substrates are preferably acted upon with negative voltage. With the pulsed and IF, RF supplies, positive voltage is also applied to the substrates. The supplies can be operated unipolarly or bipolarly. The typical, however not exclusive, process parameters during this step are:

Argon flow 60 sccm
Discharge current low-voltage arc 150 A
Substrate temperature 500° C. (partially through plasma heating, partially through radiation heating)
Process time 30 min In order to ensure the stability of the low-voltage arc discharge during the production of insulating layers, the work is either carried out with a hot, conductive auxiliary anode or a pulsed high-power supply is interconnected between auxiliary anode and ground.

6. Start of coating with the intermediate layer (approximately 15 min) CrN intermediate layer 300 nm by means of spark evaporation (source current 140 A, $N_2$ 1200 sccm, with bipolar bias of −180 V (36 µs negative, 4 µs positive). The coating can take place with and without low-voltage arc.

Up to this point the method follows that of prior art as is reflected by example in FIG. 1.

7. Transition to the functional layer (approximately 5 min)

In the transition to the functional layer proper the nitrogen is ramped from 1200 sccm down to approximately 400 sccm and subsequently an oxygen flow of 300 sccm is switched on. The DC supply current for the Cr spark cathode is simultaneously increased to 200 A. The Al spark cathode is subsequently switched on and also operated at a current of 200 A. The nitrogen flow is now switched off and the oxygen flow is subsequently run up to 400 sccm.

8. Coating with the functional layer

The bipolarly pulsed high-power supply (16), as shown in FIG. 2, is now taken into operation between both spark cathodes. In the described process, work took place with a positive or negative time mean value of the current of approximately 50 A. The pulse durations are each 20 µs for the positive as well as the negative voltage range. The peak value of the current through the bipolarly pulsed power supply depends on the particular pulse form. The difference of DC current through the particular spark cathode and peak value of the bipolarly pulsed current must not fall below the so-called holding current of the spark cathode since otherwise the spark is extinguished.

During the first 10 minutes of the coating the bias is ramped from −180 V to −60 V. The typical coating rates for doubly rotating substrates are between 3 µm/hr and 6 µm/hr.

The coating of the substrates with the functional layer proper thus takes place in pure reactive gas (in this example oxygen). The most important process parameters are once again summarized:

Oxygen flow 300 sccm
Substrate temperature 500° C.
DC source current 200 A, for the Al as well as also for the Cr source.
The bipolarly pulsed DC current between the two cathodes has a frequency of 25 kHz.
Process pressure approximately $3\times10^{-3}$ mbar As already stated, the coating can also take place simultaneously with the operation of the low-voltage arc. In this case a further increase of the reactivity is primarily achieved in the vicinity of the substrates. The simultaneous use of the low-voltage arc during the coating has, in addition, also the advantage that the DC component at the sources can be reduced. With higher arc current, this can be further reduced.

The coating process conducted in this way is stable over several hours. The spark target is covered with a thin smooth oxide layer. This is desirable and also a precondition for a largely splatter-free and stable process. The covering becomes manifest in an increase of the voltage at the spark target as was also already described in the preceding patent application CH00518/05.

In the following, three further application examples will be cited in which, however, only the deposition of the interface and the functional layer will be discussed.

EXAMPLE 2

While in the above example the production of an Al—Cr—O layer was described, in which only two spark targets were utilized, in the following the process for a pure aluminum oxide layer utilizing 4 spark targets will be described:

For the coatings, hard metal indexable inserts (tungsten carbide) were used as substrates, which had already been coated in a preceding process with a 1.5 µm thick TiN layer. The substrates were subjected to a pretreatment, which was substantially identical to the above described steps 1 to 5. Before the coating with the functional layer, no special intermediate layer was deposited, i.e. the functional layer was directly deposited on the TiN base and steps 6 and 7 were omitted. For the deposition of the functional layer (8) work took place with four spark targets and the following process parameters were used:

4 Al targets operated at 170 A DC each
bipolar current pulses, corresponding to FIG. 2, of 2 Al targets each with an output voltage of 100 V at the power supply and positive and negative pulse widths of 20 µs each
Argon flow: 50 sccm
Oxygen flow: 700 sccm
Substrate bias: DC bipolarly pulsed, +/−100 V, 38 µs negative, 4 µs positive
Substrate temperature: 695° C.

The layer obtained in this manner was characterized using the following measurements:

Layer thickness with double rotation of the substrates: 4 µm
The layer adhesion was determined at HF1 to HF2 in Rockwell indentation tests
The microhardness was determined with the Fischerscope (microindentation at F=50 mN/20 s) and was HV=1965 (+/−200), Y=319 GPa (+/−12 GPa).

XRD spectra of the layer were obtained for the angular range 2Θ/Θ as well as for grazing incidence (3°). These X-ray measurements show a crystalline layer with possibly small contributions of amorphous aluminum oxide. The aluminum oxide can clearly be identified as γ—$Al_2O_3$ phase.

EXAMPLE 3

The next example relates to the production of a zirconium oxide layer. Before the coating with the functional layer proper, the substrates were coated with an intermediate layer of ZrN. For this coating 4 targets were used for the work, which was operated at a partial pressure of nitrogen of 2 Pa with 170 A each.

The substrate temperature was 500° C. and a substrate bias of −150 V was used. The coating time for this intermediate layer was 6 min.

For the deposition of the functional layer (8) work also took place with four spark targets, corresponding to FIG. 2, and the following process parameters were used:

4 Zr targets operated at 170 A DC each
bipolar current pulses of 2 Zr targets each with an output voltage of 100 V at the power supply and positive and negative pulse widths of 20 µs each
Argon flow: 50 sccm
Oxygen flow: 700 sccm
Substrate bias: DC bipolarly pulsed, +/−40 V, 38 µs negative, 4 µs positive
Substrate temperature: 500° C.

The layer obtained in this manner was characterized using the following measurements:

Layer thickness with double rotation of the substrates: 6.5 µm
The layer adhesion was determined at HF1 with Rockwell indentation tests.
The microhardness was determined using the Fischerscope (microindentation at F=50 mN/20 s) and was HV=2450.
The layer values for the roughness were $R_a$=0.41 µm, $R_z$=3.22 µm, $R_{max}$=4.11 µm
The coefficient of friction was determined at 0.58.

By measuring the XRD spectra of the layer, a baddeleyite structure could uniquely and unambiguously be determined.

EXAMPLE 4

In the last example the production and analysis of an SiAlN layer will be discussed.

Before the coating proper with the functional layer, the substrates were coated with an intermediate layer of TiN. For this coating the work took place with 2 targets, corresponding to FIG. 2, which were operated at 180 A each at a partial pressure of nitrogen of 0.8 Pa. The substrate temperature was 500° C. and a substrate bias of −150 V was used. The coating time for this intermediate layer was 5 min.

2 SiAl targets with a ratio of Si/Al of 70/30 were operated at 170 A DC each bipolar current pulses of the 2 SiAl targets with an output voltage of 100 V at the power supply and positive and negative pulse widths of 20 μs each Argon flow: 50 sccm Oxygen flow: 800 sccm Substrate bias: DC bipolarly pulsed, +/−40 V, 38 μs negative, 4 μs positive Substrate temperature: 410° C.

The layer obtained in this manner was characterized through the following measurements:

Layer thickness with double rotation of the substrates: 6.5 μm

The layer adhesion was determined at HF2 in Rockwell indentations tests.

The microhardness was determined with the Fischerscope (microindentation at F=50 mN/20 s) and was HV=1700.

The layer values for the roughness are $R_a$=0.48 μm, $R_z$=4.08 μm, $R_{max}$=5.21 μm The coefficient of friction was determined to be 0.82.

The invention claimed is:

1. Vacuum process installation with a vacuum chamber (1) for the surface working of workpieces (3) with an arc evaporator source (5) comprising an anode (6) and a first electrode (5') which forms a target-electrode, and whereas this anode (6) and the first electrode (5') are connected to a DC power supply (13) and that a second electrode (3, 18, 20) is disposed separately from the arc evaporator source (5) and the vacuum chamber (1), characterized in that the two electrodes (5', 3, 18, 20) are connected to a bipolar pulsed power supply (16) which generates an additional discharge path.

2. Installation as claimed in claim 1, characterized in that the second electrode (20') is the cathode of a further arc evaporator source (20) and such is also connected to a DC power supply (13').

3. Installation as claimed in claim 1, characterized in that the second electrode (18) is the cathode of a sputter source (18) and such is also connected to a DC-power supply (17).

4. Installation as claimed in claim 1, characterized in that the second electrode (3) is implemented as workpiece holder (3) and, together with the workpieces (3), forms a bias electrode.

5. Installation as claimed in claim 1, characterized in that the second electrode is an evaporation crucible (22) which forms the anode of a low-voltage arc evaporator (9, 22).

6. Installation as claimed in claim 1, characterized in that the second electrode is an auxiliary electrode which forms an auxiliary anode (15) for the implementation of a low-voltage arc discharge.

7. Installation as claimed in claim 1, characterized in that between the DC power supply (13) and the pulsed power supply (16) an electric decoupling filter is disposed, wherein such includes at least one blocking diode.

8. Installation as claimed in claim 1, characterized in that the DC power supply (13) outputs a base current for the substantially interruption-free maintenance of a plasma discharge at the sources (5, 18, 20).

9. Installation as claimed in claim 1, characterized in that the installation includes a reactive gas inlet.

10. Installation as claimed in claim 1, characterized in that the frequency of the pulsed power supply (16) is in the range of 1 kHz to 200 kHz.

11. Installation as claimed in claim 1, characterized in that the pulse width ratio of the pulsed power supply (16) is set variably.

12. Installation as claimed in claim 1, characterized in that the pulse of the pulsed power supply (16) is set such that it is gapped.

13. Installation as claimed in claim 1, characterized in that the pulse edges of the pulsed power supply (16) have slopes greater than 2.0 V/ns.

14. Method for the surface working of workpieces (3) in a vacuum process installation (1) with a vacuum chamber in that with a first electrode (5') and an anode (6) of an arc evaporator source (5) whereas the anode (6) and the first electrode (5') are connected to a DC power supply (13), the first electrode forming a target electrode, and with a second electrode (3, 18, 20) disposed separated from the arc evaporator source (5) and the vacuum chamber, a layer is deposited onto the workpiece (3), wherein the arc evaporator source (5) is fed with a DC current, characterized in that both electrodes (5', 3, 18, 20) are operated connected to a bipolar pulsed power supply (16) for generating an additional discharge path.

15. Method as claimed in claim 14, characterized in that the second electrode (20') is operated as the cathode of a further arc evaporator source (20) and is also operated connected to a DC power supply (13').

16. Method as claimed in claim 14, characterized in that the second electrode (18) is operated as the cathode of a sputter source (18), and is also operated connected to a DC-power supply.

17. Method as claimed in claim 14, characterized in that the second electrode (3) is implemented as a workpiece holder (3) and, together with the workpieces (3), for a bias electrode.

18. Method as claimed in claim 14, characterized in that the second electrode is implemented as evaporation crucible (22) and is operated as the anode of a low-voltage arc evaporator (9, 22).

19. Method as claimed in claim 14, characterized in that the second electrode is operated as auxiliary electrode which forms an auxiliary anode (15), for the implementation of a low-voltage arc discharge.

20. Method as claimed in claim 14, characterized in that the DC power supply (13) and the pulsed power supply (16) is coupled with an electrical decoupling filter comprising at least one blocking diode.

21. Method as claimed in claim 14, characterized in that the DC power supply (13) is operated with a base current, such that the plasma discharge at the sources (5, 18, 20) is maintained substantially interruption-free, at the arc evaporator sources (5, 20).

22. Method as claimed in claim 14, characterized in that the sources (5, 18, 20) are operated with a process gas which comprises a reactive gas.

23. Method as claimed in claim 22, characterized in that the sources (5, 18, 20) are operated with a process gas which is exclusively a reactive gas.

24. Method as claimed in claim 22, characterized in that the sources (5, 18, 20) are operated with a process gas in which the reactive gas comprises oxygen.

25. Method as claimed in claim 14, characterized in that the pulsed power supply (16) is operated at a frequency in the range of 1 kHz to 200 kHz.

26. Method as claimed in claim 14, characterized in that the pulsed power supply (16) is operated set with a variable pulse width ratio.

27. Method as claimed in claim 14, characterized in that the pulsed power supply (16) is operated with gapped pulses.

28. Method as claimed in claim 14, characterized in that the pulsed power supply (16) is operated with pulse edges which have slopes greater than 2.0 V/ns.

29. Method as claimed in claim 14, characterized in that more than two electrodes (5, 5', 3, 18, 20) are operated in the vacuum process installation (19) which comprises reactive gas, wherein only two electrodes are operated with a single pulsed power supply (16) and the one of the two electrodes is operated as the first electrode (5') of an arc evaporator source (5).

30. Method as claimed in claim 29, characterized in that the two pulsed electrodes (5, 5') are operated as arc evaporator sources (5, 20) and at least one further electrode is operated as sputter source (18).

31. Installation as claimed in claim 13, characterized in that the pulse edges of the pulsed power supply (16) have slopes in the range of 0.02V/ns to 2.0 V/ns.

32. Installation as claimed in claim 13, characterized in that the pulse edges of the pulsed power supply (16) have slopes in the range of 0.1 V/ns to 1.0 V/ns.

33. Installation as claimed in claim 3, characterized in that the sputter source (18) is of a magnetron source (18).

* * * * *